United States Patent
Brubaker (10) Patent No.: US 9,342,226 B2
(45) Date of Patent: May 17, 2016

(54) CYCLE-TAPPING TECHNIQUE FOR SELECTING OBJECTS

(75) Inventor: Jeffrey T. Brubaker, Carrboro, NC (US)

(73) Assignee: SYNOPSYS, INC., Mountain View, CA (US)

( * ) Notice: Subject to any disclaimer, the term of this patent is extended or adjusted under 35 U.S.C. 154(b) by 724 days.

(21) Appl. No.: 12/610,223

(22) Filed: Oct. 30, 2009

(65) Prior Publication Data

US 2011/0022987 A1    Jan. 27, 2011

Related U.S. Application Data

(60) Provisional application No. 61/227,720, filed on Jul. 22, 2009.

(51) Int. Cl.
*G06F 3/048* (2013.01)
*G06F 3/0484* (2013.01)
*G06F 3/0482* (2013.01)
*G06F 17/50* (2006.01)

(52) U.S. Cl.
CPC .......... *G06F 3/04845* (2013.01); *G06F 3/0482* (2013.01); *G06F 17/5045* (2013.01)

(58) Field of Classification Search
CPC ................ H05K 3/3421; H05K 1/141; H05K 2201/1031; H05K 2201/10878; H05K 2201/10909; H05K 2201/10946; H05K 3/20; H05K 3/326; H05K 3/4015; H05K 2201/0397; H05K 2201/068; H05K 2201/10318; H05K 2201/103
USPC .................................................. 715/708, 812
See application file for complete search history.

(56) References Cited

U.S. PATENT DOCUMENTS

| | | | |
|---|---|---|---|
| 6,323,884 B1 * | 11/2001 | Bird et al. | 715/810 |
| 7,911,481 B1 * | 3/2011 | Ballagh et al. | 345/629 |
| 2007/0168873 A1 * | 7/2007 | Lentz | 715/763 |
| 2010/0205575 A1 * | 8/2010 | Arora et al. | 716/11 |
| 2010/0205576 A1 * | 8/2010 | Majumder et al. | 716/18 |

OTHER PUBLICATIONS

Laung-Terng Wang, Electronic design automation (Feb. 26, 2009).*
Of Mike Nuts, 3D Studio MAX Hotkeys and Mouse Essentials (Jan. 12, 2007) http://www.3dvalley.com/tutorials/3d-studio-max-hotkeys-and-mouse-essentials/.*

(Continued)

*Primary Examiner* — Amy Ng
*Assistant Examiner* — Di Xiao
(74) *Attorney, Agent, or Firm* — Park, Vaughan, Fleming & Dowler LLP; Laxman Sahasrabuddhe (57) ABSTRACT

A technique for selecting an object is described. During this technique, a computer system selects an object from multiple objects associated with a circuit design in an electronic-design-automation (EDA) environment based at least on a current cursor location and a current design command. For example, the computer system may select the object by determining distances between the cursor location and objects in at least a subset of the multiple objects, and then identifying the minimum distance in the distances. Furthermore, the object may be selected either with or without a user first providing an object-selection input. If the object-selection input is provided, the user may do so by performing one or more mouse clicks or a keyboard shortcut, as opposed to using a window (such as a dialog box or a drop-down menu) that can be displayed in the EDA environment.

15 Claims, 7 Drawing Sheets

(56) References Cited

OTHER PUBLICATIONS

Sara Ford, Did you know . . . You can bind the show "Errors", "Warnings", and "Messages" buttons to keyboard shortcuts?—#200 (Apr. 23, 2008). http://saraford.net/2008/04/23/did-you-know-you-can-bind-the-show-errors-warnings-and-messages-buttons-to-keyboard-shortcuts-200/.*

David Harrington, Inside AutoCad 2002, (published on Jul. 19, 2001).*

* cited by examiner

CYCLE-TAPPING TECHNIQUE FOR SELECTING OBJECTS

CROSS REFERENCE TO RELATED APPLICATIONS

This application claims priority under 35 U.S.C. 119(e) to U.S. Provisional Application Ser. No. 61/227,720, entitled "Cycle Tapping," by Jeffrey Thomas Brubaker, filed on Jul. 22, 2009, the contents of which are herein incorporated by reference.

BACKGROUND

1. Field

This disclosure generally relates to electronic design automation. More specifically, this invention relates to electronic-design-automation software that facilitates object selection in an associated graphical user interface.

2. Related Art

Electronic-design-automation (EDA) software is widely used to design integrated circuits (ICs). These ICs may include inter-connected components or objects, which are arranged in multiple layers. However, as circuits become larger and more complicated, it is increasingly difficult for users of EDA software to select and manipulate the objects.

For example, objects in different layers in an IC may be collocated at the same position in a two-dimensional display (i.e., they may overlap each other), which is associated with the EDA software. In addition, there may be internal structure to an object (i.e., there may be objects contained within an object.) For example, objects in the same layer or in different layers may overlap. As a consequence, an object in a layer that is currently being viewed or modified may obstruct information about other objects that are within or underneath it in the same layer or lower layers.

In order to view or select one of the other objects, a user of the EDA software often has to perform a time-consuming manual-selection process, including: opening a dialog box or drop-down menu, and selecting one or more operations or commands using a keyboard or a mouse. In particular, to select another object, the user typically makes unwanted layers invisible or not selectable, and then restores their visibility later. Alternatively, if the user is making a selection within an object, such as when defining a wire route, it can be difficult for the user to select a specific layer where a wire route starts. Therefore, the user often access a dialog box which specifies the object.

In a large, complicated circuit design, the user may be required to perform the manual-selection process multiple times, which increases the time and effort needed to design circuits, thereby increasing their cost. In addition, the manual-selection process is often tiresome, which may degrade the user experience, and therefore can impact customer retention and sales of EDA software.

SUMMARY

One embodiment of the present disclosure provides a computer system that selects an object. During operation, the computer system receives a cursor location in an electronic-design-automation (EDA) environment that includes multiple objects associated with a circuit design. Then, the computer system selects the object from the multiple objects based at least on the cursor location and a current design command without receiving, from a user, an object-selection input associated with a window that can be displayed in the EDA environment.

In some embodiments, selecting the object involves: determining a subset of the multiple objects that are proximate to the cursor location and which are expected to be operated on by the current design command; determining distances between the cursor location and objects in at least a subset of the multiple objects; and identifying the minimum distance in the distances, which is associated with the object. Note that the multiple objects may be arranged in multiple layers in the circuit design, and that the subset of the multiple objects may include a via or an instance between layers in the multiple layers.

In some embodiments, the computer system receives a user input that specifies the current design command. Furthermore, after receiving the user input, the object may be selected without receiving an object-selection input from the user. Alternatively, the computer system may receive the object-selection input from a user-interface device prior to selecting the object, and the selection may also be based on the object-selection input. For example, the user-interface device may be a mouse, and the object-selection input may correspond to a mouse click. Alternatively or additionally, the user-interface device may include a keyboard, and the object-selection input may correspond to a keyboard shortcut, which may involve activating one or more keyboard keys or keyboard icons.

Note that the object-selection input may specify the subset of the multiple objects that are proximate to the cursor location and which include the object. Furthermore, the object-selection input may correspond to multiple mouse clicks that scroll through objects in the subset of the multiple objects. In some embodiments, the multiple objects are arranged in multiple layers in the circuit design, and the objects in the subset of the multiple objects are in different layers in the multiple layers.

In some embodiments, the computer system receives, from the user, position information for a first new object in the circuit design, and the computer system presents the first new feature in the EDA environment based at least on the position information. Note that the position information may correspond to a change in the cursor location, and the first new object may include an interconnect. Furthermore, the computer system may select attributes of the first new object in the circuit design based at least on the current design command and the selected object.

Additionally, the computer system may store information associated with a subset of objects in the multiple objects that are proximate to the current cursor position and which include the object. If the computer system receives error information, such as information about an error, from the user (for example, via the user-interface device), which indicates that the selected object is incorrect, the computer system may: remove the first new object from the EDA environment; select a second object in the stored information associated with the subset of the multiple objects, which is different than the object; and present a second new object in the EDA environment based at least on the position information and/or the selected attributes. For example, the user-interface device may include the mouse, and the error information may correspond to a mouse click. Alternatively or additionally, the user-interface device may include the keyboard, and the error information may correspond to the same or a different keyboard shortcut, which may involve activating one or more keyboard keys or keyboard icons.

Alternatively, in some embodiments where the multiple objects are arranged in multiple layers in the circuit design, if the computer system receives error information from the user (for example, via the user-interface device), which indicates that the selected object is incorrect, the computer system may receive from the user an object-selection input that specifies a second object, which is different than the object and which is in another layer than the object. In response to the received error information and the object-selection input, the computer system may: remove the first new object from the EDA environment, and may present the second new object in the EDA environment based at least on the position information and the object-selection input (i.e., the EDA software may pick another object where the command starts).

In some embodiments, wherein the multiple objects are arranged in multiple layers in the circuit design, the computer system may receive from the user the object-selection input that specifies the second object, which is different than the object and which is in another layer than the object. In response to the received object-selection input, the computer system may present the second new object in the EDA environment based at least on the position information and the object-selection input.

Another embodiment provides a method including at least some of the above-described operations.

Another embodiment provides a computer-program product for use in conjunction with the computer system.

Another embodiment provides a graphical user interface, associated with the EDA environment, which includes the multiple objects.

BRIEF DESCRIPTION OF THE FIGURES

Note that like reference numerals refer to corresponding parts throughout the drawings. Moreover, multiple instances of the same type of part are designated by a common prefix separated from an instance number by a dash.

DETAILED DESCRIPTION

The following description is presented to enable any person skilled in the art to make and use the disclosure, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present disclosure is not intended to be limited to the embodiments shown, but is to be accorded the widest scope consistent with the principles and features disclosed herein.

Embodiments of a computer system, a method, and a computer-program product (i.e., software) for use with the computer system are described. During operation, the computer system selects an object from multiple objects associated with a circuit design in an electronic-design-automation (EDA) environment based at least on a current cursor location and a current design command. For example, the computer system may select the object by: determining a subset of the multiple objects that are proximate to the cursor location and which are expected to be operated on by the current design command; determining distances between the cursor location and objects in at least a subset of the multiple objects; and then identifying the minimum distance in the distances. Furthermore, the object may be selected either with or without a user first providing an object-selection input. If the object-selection input is provided, the user may do so by performing one or more mouse clicks or a keyboard shortcut, as opposed to using a window (such as a dialog box or a drop-down menu) that can be displayed in the EDA environment.

By allowing the computer system and/or the user to select the object, this interaction technique may help make the EDA software easier to use, which increases user productivity and lowers circuit development costs. In addition, the transaction-history technique can improve the user experience, and thus, customer retention and sales of EDA software.

Figure 1:
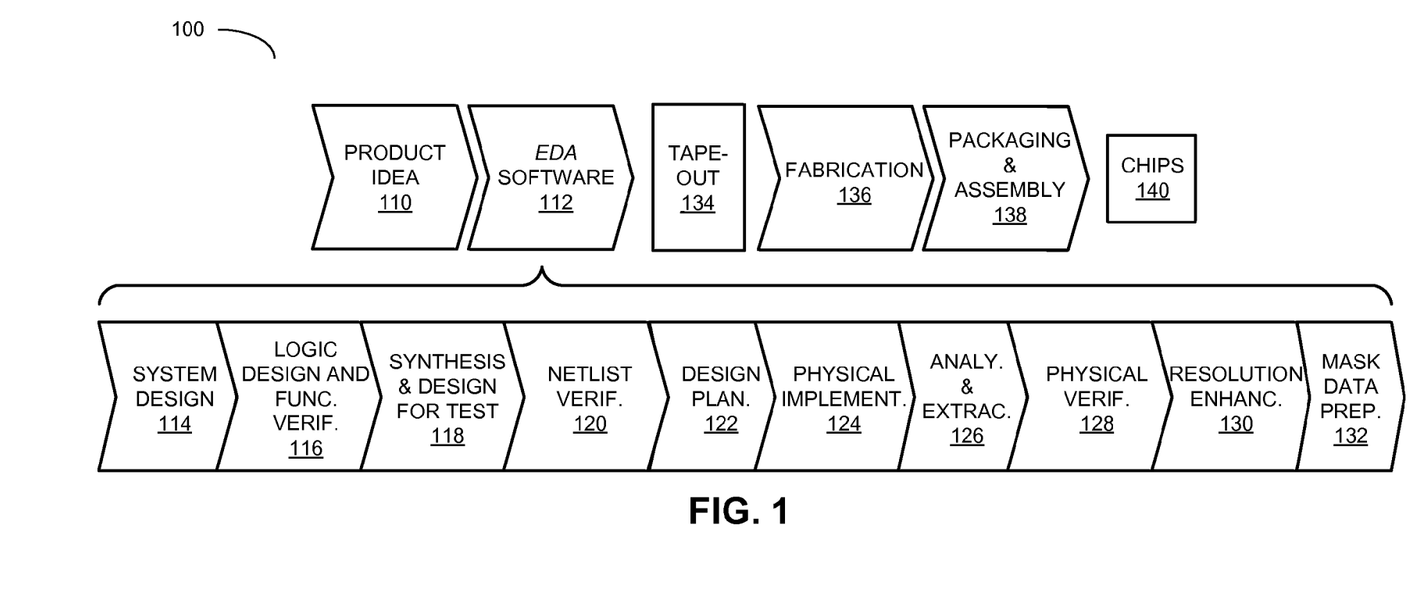
FIG. 1 is a flowchart illustrating various operations in the design and fabrication of an integrated circuit in accordance with an embodiment of the present disclosure.

We now describe embodiments of design and fabrication of integrated circuits or chips. FIG. 1 presents a flowchart 100 illustrating the various operations in the design and fabrication of an integrated circuit. This process starts with the generation of a product idea (110), which is realized during a design process that uses EDA software (112). When the design is finalized, it can be taped-out (134). After tape-out, a semiconductor die is fabricated (136) and packaging and assembly processes (138) are performed, which ultimately result in finished chips (140).

Note that the design process that uses EDA software (112) includes operations 114-132, which are described below. This design flow description is for illustration purposes only. In particular, this description is not meant to limit the present disclosure. For example, an actual integrated circuit design may require a designer to perform the design operations in a different sequence than the sequence described herein.

During system design (114), designers describe the functionality to implement. They can also perform what-if planning to refine the functionality and to check costs. Note that hardware-software architecture partitioning can occur at this stage. Exemplary EDA software products from Synopsys, Inc. of Mountain View, Calif. that can be used at this stage include: Model Architect®, Saber®, System Studio®, and Designware® products.

Then, during logic design and functional verification (116), VHDL or Verilog code for modules in the circuit is written and the design is checked for functional accuracy. More specifically, the design is checked to ensure that it produces the correct outputs. Exemplary EDA software products from Synopsys, Inc. of Mountain View, Calif. that can be used at this stage include: VCS®, Vera®, Designware®, Magellan®, Formality®, ESP® and Leda® products.

Next, during synthesis and design for test (118), VHDL/Verilog is translated to a netlist. This netlist can be optimized for the target technology. Additionally, tests can be designed and implemented to check the finished chips. Exemplary EDA software products from Synopsys, Inc. of Mountain View, Calif. that can be used at this stage include: Design Compiler®, Physical Compiler®, Test Compiler®, Power Compiler®, FPGA Compiler®, Tetramax®, and Designware® products.

Moreover, during netlist verification (120), the netlist is checked for compliance with timing constraints and for correspondence with the VHDL/Verilog source code. Exemplary EDA software products from Synopsys, Inc. of Mountain View, Calif. that can be used at this stage include: Formality®, Primetime®, and VCS® products.

Furthermore, during design planning (122), an overall floor plan for the chip is constructed and analyzed for timing and top-level routing. Exemplary EDA software products from Synopsys, Inc. of Mountain View, Calif. that can be used at this stage include: Astro® and IC Compiler® products.

Additionally, during physical implementation (124), the placement (positioning of circuit elements) and routing (connection of the same) occurs. Exemplary EDA software products from Synopsys, Inc. of Mountain View, Calif. that can be used at this stage include: the Astro® and IC Compiler® products.

Then, during analysis and extraction (126), the circuit function is verified at a transistor level, which permits refinement. Exemplary EDA software products from Synopsys, Inc. of Mountain View, Calif. that can be used at this stage include: Astrorail®, Primerail®, Primetime®, and Star RC/XT® products.

Next, during physical verification (128), the design is checked to ensure correctness for: manufacturing, electrical issues, lithographic issues, and circuitry. Exemplary EDA software products from Synopsys, Inc. of Mountain View, Calif. that can be used at this stage include the Hercules® product.

Moreover, during resolution enhancement (130), geometric manipulations of the layout are performed to improve manufacturability of the design. Exemplary EDA software products from Synopsys, Inc. of Mountain View, Calif. that can be used at this stage include: Proteus®, Proteus®AF, and PSMGED® products.

Additionally, during mask-data preparation (132), the 'tape-out' data for production of masks to produce finished chips is provided. Exemplary EDA software products from Synopsys, Inc. of Mountain View, Calif. that can be used at this stage include the Cats® family of products.

Embodiments of the present disclosure can be used during one or more of the above-described stages. Specifically, in some embodiments the present disclosure can be used in EDA software 112, which may provide a custom schematic editor and simulation environment.

Figure 2A:
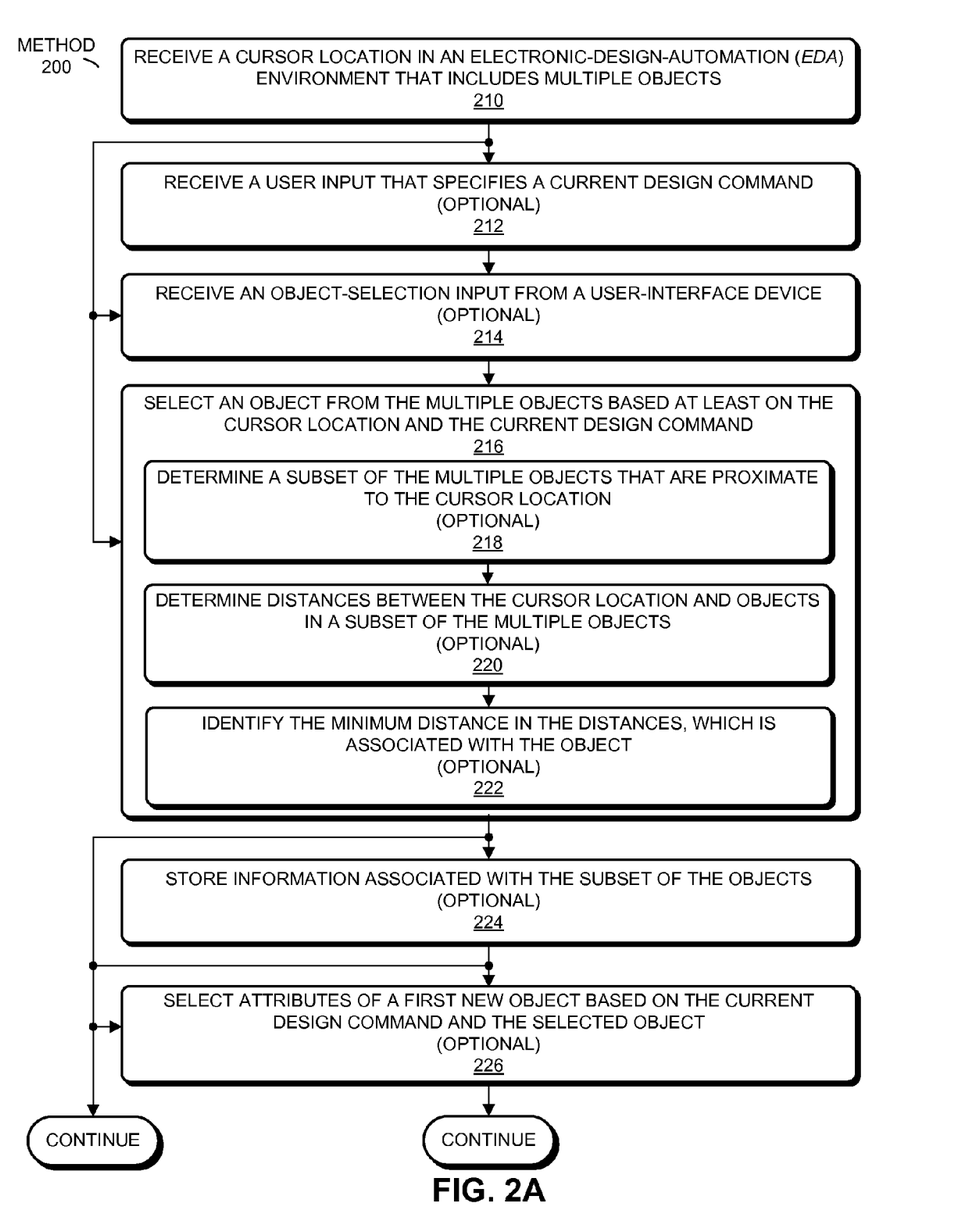
FIG. 2A is a flowchart illustrating a method for selecting an object in accordance with an embodiment of the present disclosure.
Figure 2B:
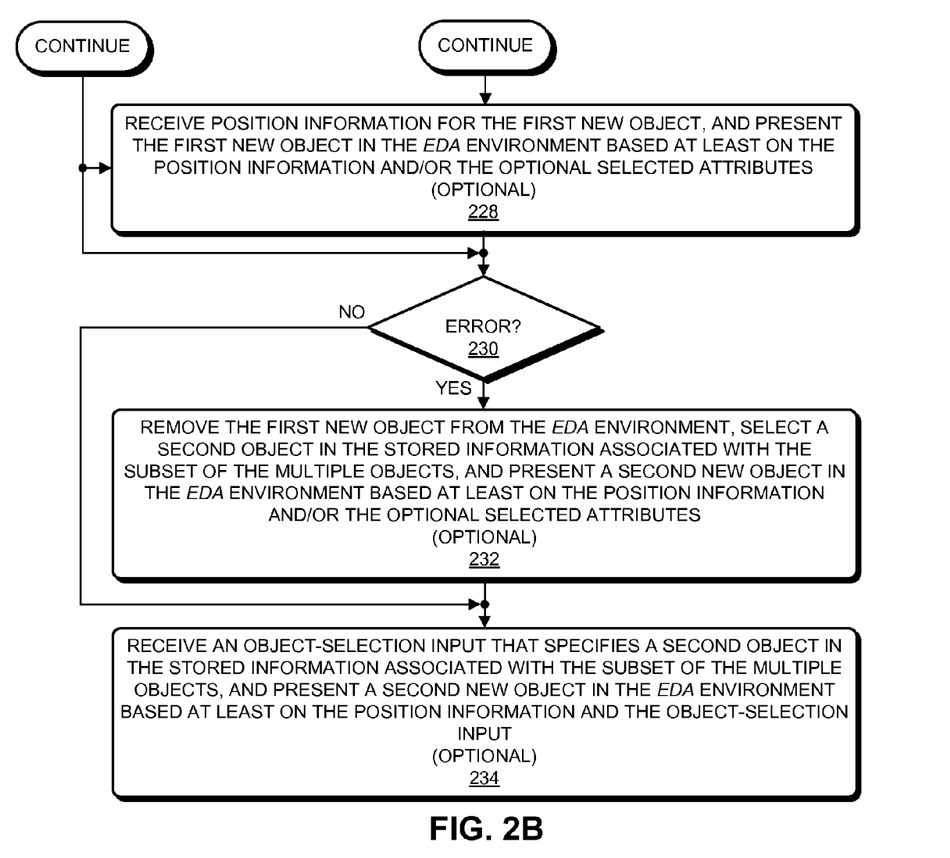
FIG. 2B is a flowchart illustrating a continuation of the method in FIG. 2A in accordance with an embodiment of the present disclosure.

We now describe embodiments of a technique for selecting an object. FIGS. 2A and 2B present flowcharts illustrating a method 200 for selecting an object associated with an EDA environment, such as that provided by EDA software that executes on a computer system. During operation, the EDA software receives a cursor location in an electronic-design-automation (EDA) environment that includes multiple objects (operation 210), which are associated with a circuit design. Then, the EDA software selects the object from the multiple objects based at least on the cursor location and a current design command without receiving, from a user, an object-selection input associated with a window that can be displayed in the EDA environment (operation 216).

In some embodiments, selecting the object optionally involves: determining a subset of the multiple objects that are proximate to the cursor location and which are expected to be operated on by the current design command (operation 218); determining distances between the cursor location and objects in at least a subset of the multiple objects (operation 220); and identifying the minimum distance in the distances, which is associated with the object (operation 222).

Note that other objects nearby the selected object are usually still available to the user without having the user change which layers are visible or selectable. In particular, shapes in the circuit design may be aligned on a visible grid, and the cursor may be confined to coordinates on the grid. The EDA software may attempt to determine which object is the one that the user most likely wants based at least on that grid position.

Although the set of nearby objects may be determined by proximity to the grid position, this set is may be sorted by distance to the actual cursor position so the user can pick between shapes by moving the cursor directly, even if they are both at the same grid position. Furthermore, the set typically only contains those objects that can be selected. Note that the user can control what is selectable, and objects that are too small to be rendered may be removed from the set of nearby objects.

In some embodiments, the set of nearby objects is sorted by layer. For example, objects on layers closest to the active layer (the layer on which shapes are being created) may be prioritized ahead of other shapes. Furthermore, the EDA software may allow selection of vertices or edges of a shape. In this case, the vertices may be given priority over edges because it is difficult to select vertices.

Once the EDA software has performed these calculations, the most likely object may be 'activated' and drawn with a highlight. By clicking, the user can select this object. However, the user can still elect to pick any other object in the set of nearby objects by using a keyboard shortcut, which cycles to the next closest object until the set of nearby objects has been exhausted and repeats.

Note that the multiple objects may be arranged in multiple layers in the circuit design, and that the subset of the multiple objects may include a via between layers in the multiple layers. Moreover, individual shapes within the via may be used to determine the distance. For example, a via typically includes three shapes, which are each on different layers with different sizes (although, the center is typically coincident). Therefore, a via may be treated as three separate shapes when deciding which object is closest to the cursor location.

In some embodiments, the EDA software optionally receives a user input that specifies the current design command (operation 212). Furthermore, after receiving the user input, the object may be selected without receiving an object-selection input from the user. Alternatively, the EDA software may optionally receive an object-selection input from a user-interface device prior to selecting the object (operation 214), and the selection may also be based on the object-selection input. For example, the user-interface device may be a mouse, and the object-selection input may correspond to a mouse click. Alternatively or additionally, the user-interface device may include a keyboard, and the object-selection input may correspond to a keyboard shortcut, which may involve activating one or more keyboard keys or keyboard icons.

Note that the object-selection input may specify the subset of the multiple objects that are proximate to the cursor location and which include the object. Furthermore, the object-selection input may correspond to multiple mouse clicks that scroll through objects in the subset of the multiple objects. In some embodiments, the multiple objects are arranged in multiple layers in the circuit design, and the objects in the subset of the multiple objects are in different layers in the multiple layers.

In particular, the EDA software may allow different operations to be performed, such as creation or manipulation of shapes on the canvas in the EDA environment. Consequently, the selection may involve a full object or, in some cases, a partial object in the form of a vertex or edge. However, for some operations, it may be useful to pick parts of objects that cannot normally be selected. Examples of this are vias and instances. Both of these objects contain other objects that cannot normally be selected because they are referenced objects. For purposes of definitions, note that an 'instance' or a 'via' is a single object within one circuit design that refers to another circuit design. Furthermore, the other objects cannot be selected because they do not exist in the circuit design being edited. This choice is not arbitrary. Each circuit design may be equivalent to a file on disk. Opening a circuit design for editing may lock out all other users from editing the circuit design (however, they may be able to view its contents). Thus, to edit these shapes, the user typically must open the referenced circuit design.

Although the user cannot select these shapes in a via or an instance, they can see them and they can use them as inputs to operations such as 'Create Interconnect.' For example, 'Create Interconnect' may create a path between two objects in a circuit design. The layer on which this path is created and its shape may be important in the circuit design. To make things easier for the user, the EDA software may reconfigure the active layer and the path width based at least on the object under the cursor when the command starts. However, if an instance or via is under the cursor when the command starts, the command may need to determine which shape referenced by that via or instance is relevant. Therefore, the command may change the activation mode to allow activation or highlighting of these shapes within the master.

When staring these operations, the active shape may be relevant, even though the user did not have the opportunity to pick the proper sub-shape. Consequently, the EDA software may determine the appropriate sub-shape based at least on the previously described approach except that now the EDA software may take into account the fact that the operation may need these sub-shapes to be available. In this way, the EDA software may prioritize the shape the user indicated before starting the command.

In some embodiments, the EDA software optionally selects attributes of a first new object in the circuit design based at least on the current design command and the selected object (operation 226). (Note that this operation is sometimes referred to as 'tapping.') Furthermore, the EDA software may optionally receive, from the user, position information for the first new object in the circuit design (operation 228); and the EDA software may optionally present the first new object in the EDA environment based at least on the position information and/or the optional selected attributes (operation 228). Note that the position information may correspond to a change in the cursor location, and the first new object may include an interconnect. (More generally, the first new object may be associated with any creation command. However, a create interconnect command may be relevant because it supports retrieving the most attributes from the object.)

Additionally, the EDA software may optionally store information associated with the subset of objects in the multiple objects that are proximate to the current cursor position and which include the object (operation 224). If the EDA software optionally receives error information from the user (operation 230) (for example, via the user-interface device), which indicates that the selected object is incorrect, the EDA software may optionally: remove the first new object from the EDA environment (operation 232); select a second object in the stored information associated with the subset of the multiple objects, which is different than the object (operation 232); and present a second new object in the EDA environment based at least on the position information and/or the optional selected attributes (operation 232). For example, the user-interface device may include the mouse, and the error information may correspond to a mouse click. Alternatively or additionally, the user-interface device may include the keyboard, and the error information may correspond to the same or a different keyboard shortcut, which may involve activating one or more keyboard keys or keyboard icons. Note that the ability to cycle to the next object near the starting point via a user-interface command (such as a keyboard shortcut), e.g., the ability to change to other objects after a first point is inserted, is sometimes referred to as 'cycle tapping.'

Alternatively, in some embodiments where the multiple objects are arranged in multiple layers in the circuit design, if the EDA software receives error information from the user (for example, via the user-interface device), which indicates that the selected object is incorrect, the EDA software may receive from the user an object-selection input that specifies a second object, which is different than the object and which is in another layer than the object. In response to the received error information and the object-selection input, the EDA software may: remove the first new object from the EDA environment, and may present the second new object in the EDA environment based at least on the position information and the object-selection input (i.e., the EDA software may pick another object where the command starts).

For example, after starting a command, the EDA software may present After starting the command, the system presents to the user a graphical representation of an object that the user is creating. The user may recognize in this presentation an error, such as starting from the wrong overlapping object. Using a keyboard shortcut or other user-interface device, the user can switch the initial tap object without having to restart his path. All attributes dependent on this object (including: the initial layer, net, path width, path end extension and small adjustments automatically made to the start point to better align with the tapped object) may be updated by the EDA software without eliminating information in the entered path. Then, the presentation may be updated to show the user these new attributes.

In some embodiments, wherein the multiple objects are arranged in multiple layers in the circuit design, the EDA software may optionally receive from the user the object-selection input that specifies the second object (operation 234), which is different than the object and which is in another layer than the object. In response to the received object-selection input, the EDA software may optionally present the second new object in the EDA environment based at least on the position information and the object-selection input (operation 234).

In some embodiments of method 200 there are additional or fewer operations. Moreover, the order of the operations may be changed and/or two or more operations may be combined into a single operation. For example, operation 212 may be performed before operation 210, i.e., the command may be active first, then the cursor motion may be processed to determine the active object. Clicking may 'tap' that object. Furthermore, when the command is changed (such as during an 'Infix' operation), the active object may be recomputed based at least on the new command settings (which enables hierarchical activation). In both cases, the set of nearby objects may be recorded to allow the user to fix the object the EDA software picks. Note that, if the EDA software picks the wrong object, this approach allows the user to fix the error. Additionally, in some embodiments operations 216-222 are performed after operation 210 and before operation 212. This may allow the object that will be picked to be highlighted before the object-selection input (such as a click) in operation 214.

In an exemplary embodiment, features of one or more software operations (such as 'Create Interconnect') depend on the object under the cursor position. These features may include: automatically aligning the start point with the referenced object (which is sometimes referred to as a 'tap object'), switching to the appropriate layer, setting the path width and end style/extension, etc. Moreover, the referenced object may be determined by a heuristic that involves selectable types that are filtered by the distance to the snap cursor, and which are then sorted based at least on: the actual cursor position, the layer and/or the type (with respect to vertices and edges).

Note that selectable types may change when inside a command. Therefore, the referenced object may be computed differently within the command than outside of the command. Furthermore, either more or fewer types may be selectable when the command is active than when it is not.

Although one object is the reference object, when the one or more features of the one or more software operations are determined by the object under the cursor additional potential reference objects are stored. The user may switch to the referenced objects without re-entering the first point. This may also update the one or more features. Thus, the user may only need to correctly specify the start point. In particular, the referenced object can be changed after the cursor is moved, and when the user recognizes (from the presentation of the new object) that the referenced object is not the intended one.

In some cases, the first point is entered before the command starts. Because the selectable types may change when inside of a command, the user may not have the opportunity to select some objects. However, the user may use additional stored potential reference objects to switch to other reference objects that were previously unselectable before starting the command.

Figure 3A:
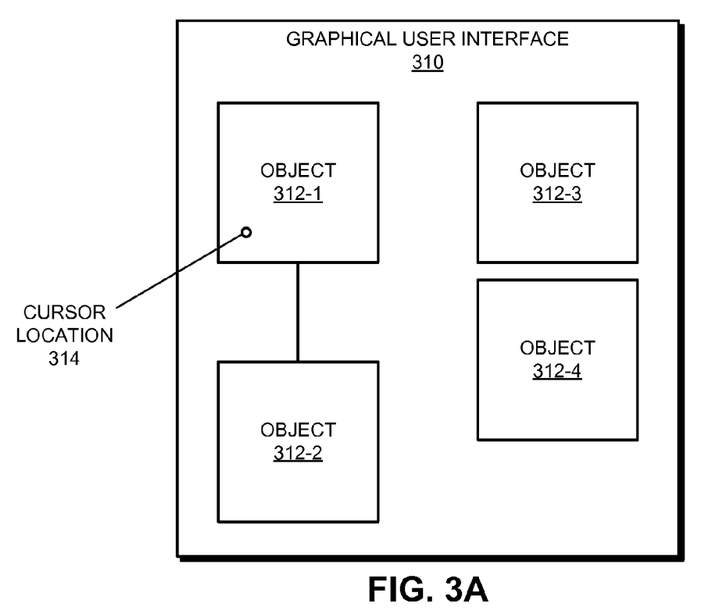
FIG. 3A is a drawing illustrating a graphical user interface that includes multiple objects in accordance with an embodiment of the present disclosure.

We now describe embodiments of a graphical user interface that is associated with the EDA environment, and which displays the multiple objects. FIG. 3A presents a graphical user interface 310 that includes multiple objects 312, which are arranged in multiple layers in a circuit design. In a 'scroll-through' mode, a user can quickly 'see' all of the objects associated with a location in graphical user interface 310. In particular, when the user activates the scroll-through mode (for example, by activating a key or an icon on a keyboard), the user can sequentially view the objects by clicking multiple times using a user-interface device, such as a mouse (which, as noted previously, is sometimes referred to as 'cycle tapping'). Furthermore, the objects that are highlighted during cycle tapping may be context dependent, for example, based on the current or active design command or operation.

For example, one of the objects (such as object 312-1) may be a box that includes multiple objects arranged in a multi-level hierarchy. If the user clicks on the box, an object instance (i.e., one of the internal objects) may be displayed. However, if a design command has not already been selected, then when the user clicks on object 312-1 the EDA software may not 'know' what the user is referring to (i.e., the context may be absent).

The user may remedy this by first selecting a design command, such as a "connect wire path" or "interconnect" command (i.e., a command that activates a router). For example, the user may select this design command by activating a key or an icon on a keyboard. Then, when the user clicks on object 312-1, there is a context associated with a current cursor location, such as cursor location 314. In particular, cursor location 314 is a point that can be connected to inside of an object instance in the multi-level hierarchy (in this example, inside of object 312-1). In essence, by selecting the command and clicking on cursor location 314, the user has parsed the multi-level hierarchy so that it is transparent.

Figure 3B:
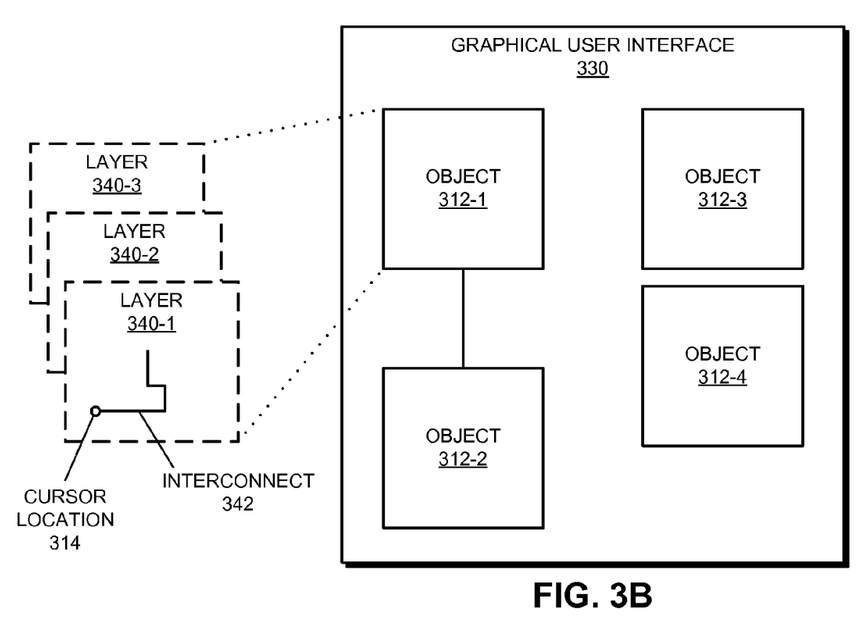
FIG. 3B is a drawing illustrating a graphical user interface that includes multiple objects in accordance with an embodiment of the present disclosure.

Note that, once this occurs, cycle tapping becomes even more relevant, because there may be many additional objects collocated under cursor location 314 than before object 312-1 was 'split up.' For example, as shown in FIG. 3B, which presents a graphical user interface 330, object 312-1 may be a via that has three layers 340, all of which overlap (i.e., are on top of one another). (In FIG. 3B, layers 340 are shown offset from object 312-1, and from each other, for clarity.) In some embodiments, by cycle tapping, the user may cycle or scroll through layers 340 using a mouse or a keyboard (and without opening a pop-up dialog box or a drop-down menu), and may select one of the layers, such as layer 340-1. Then, the user may create an interconnect 342 in layer 340-1 by moving the cursor away from cursor location 314.

Unfortunately, users occasionally make mistakes when using EDA software. For example, the user or the EDA software may select the wrong layer in object 312-1. Typically, users don't notice such an error until later, for example, after they have created interconnect 342. This problem may be addressed using the functionality associated with cycle tapping. In particular, when the user clicked on object 312-1, all of the available interconnect paths from the current cursor location may have been stored in a so-called 'tap set' (which is maintained until the next tap event). (More general; any shape in a circuit design on any level of the hierarchy on any layer may be stored in the tap set. Note that interconnects can be created from any shape to any shape, and the source may be useful in providing the width, start point, layer, net name, etc.) For a via, the tap set may include all of the objects under cursor location 314, i.e., all of layers 340. Then, the 'tap object' (i.e., layer 340-1) was selected by the user. Alternatively, the EDA software may have selected the tap object based at least on a set of predefined rules, such as using a distance calculation to the nearest object to cursor location 314.

Figure 3C:
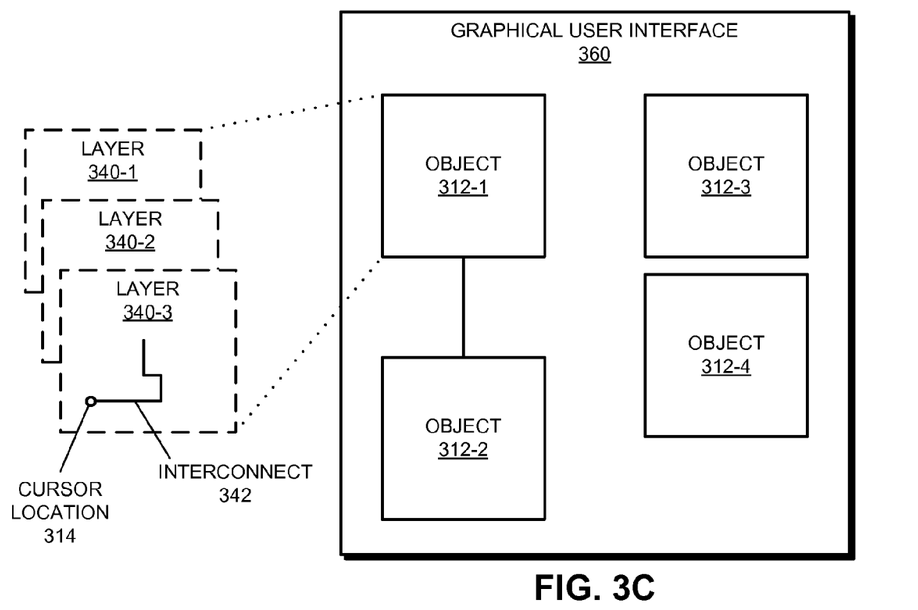
FIG. 3C is a drawing illustrating a graphical user interface that includes multiple objects in accordance with an embodiment of the present disclosure.

Consequently, if interconnect 342 is created in the wrong layer, by selecting the cycle key (for example, by activating a particular key or an icon on a keyboard), the user can click to cycle tap through layers 340 in the tap set, and may select another object (such as layer 340-3). Next, as shown in FIG. 3C, which presents a graphical user interface 360, interconnect 342 may be redrawn in layer 340-3, i.e., those options or operations that the user previously did to create interconnect 342 in layer 340-1 and would have been set if the user had clicked on layer 340-3 may be applied in layer 340-3. Thus, with minimal effort, the user can use cycle tapping to fix errors.

Note that in some embodiments the EDA software may select an object without user action or input. For example, when the user selects the "connect wire path" or "interconnect" command, the EDA software may select layer 340-1 in object 312-1 based at least on cursor location 314 and this design command (thus, the EDA software may select the object for the user). If the wrong layer is selected for the user, the technique in the preceding paragraph may be used to correct the mistake.

In some embodiments, cycle tapping is also used to inherently select attributes (i.e., without additional user action). For example, the attributes of interconnect 342 may be inferred from layer 340-1, layer 340-3 or object 312-1. In particular, the attributes may be inferred from the object that was selected, either by the user or by the EDA software. Note that the inferred attributes may include: a width, a net name, a layer, a style, a type of end extension, a type of beginning extension, and/or a center line adjustment.

Figure 4:
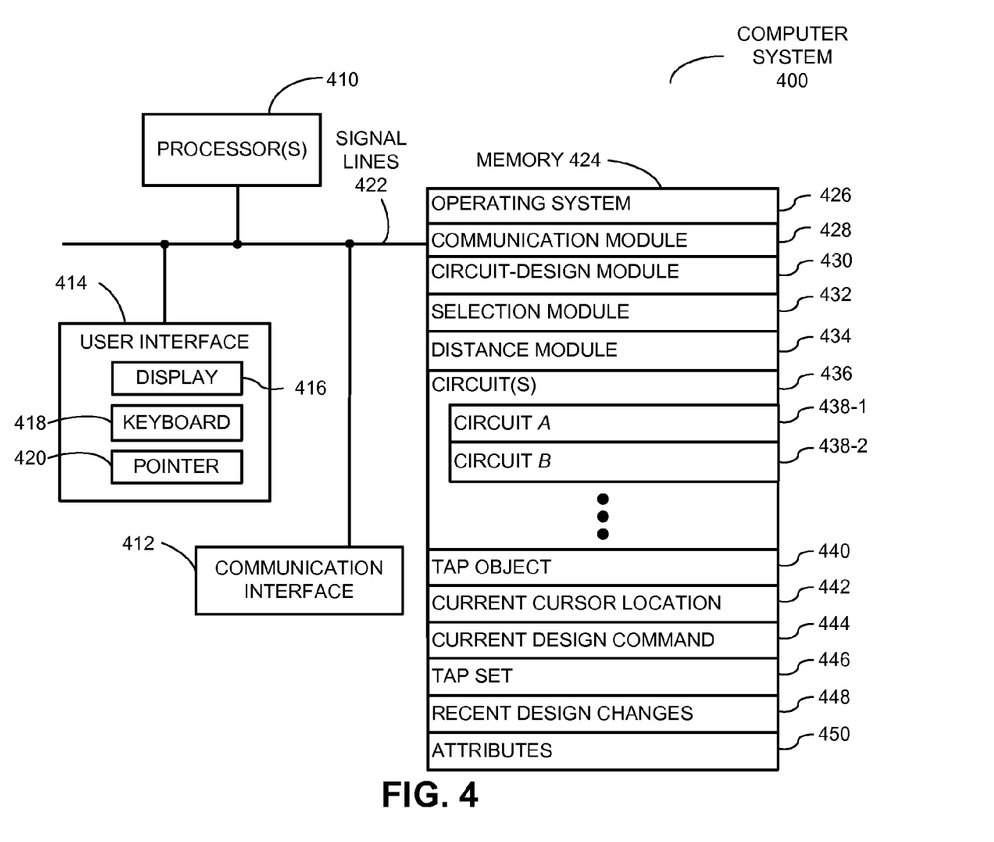
FIG. 4 is a block diagram illustrating a computer system that performs the method of FIGS. 2A and 2B in accordance with an embodiment of the present disclosure.

We now describe embodiments of a computer system that selects an object. FIG. 4 presents a block diagram illustrating a computer system 400 that performs method 200 (FIGS. 2A and 2B). Computer system 400 includes: one or more processors 410, a communication interface 412, a user interface 414, and one or more signal lines 422 coupling these components together. Note that the one or more processing units 410 may support parallel processing and/or multi-threaded operation, the communication interface 412 may have a persistent communication connection, and the one or more signal lines 422 may constitute a communication bus. Moreover, the user interface 414 may include: a display 416, a keyboard 418, and/or a pointer 420, such as a mouse.

Memory 424 in computer system 400 may include volatile memory and/or non-volatile memory. More specifically, memory 424 may include: ROM, RAM, EPROM, EEPROM, flash, one or more smart cards, one or more magnetic disc storage devices, and/or one or more optical storage devices. Memory 424 may store an operating system 426 that includes procedures (or a set of instructions) for handling various basic system services for performing hardware-dependent tasks. Memory 424 may also store procedures (or a set of instructions) in a communication module 428. These communication procedures may be used for communicating with one or more computers and/or servers, including computers and/or servers that are remotely located with respect to computer system 400.

Memory 424 may also include multiple program modules (or sets of instructions), including: circuit-design module 430 (or a set of instructions), selection module 432 (or a set of instructions) and/or distance module 434 (or a set of instructions). Note that one or more of these program modules (or sets of instructions) may constitute a computer-program mechanism.

During a design session, a user may use circuit-design module 430 to edit or simulate one or more circuits 436 (or circuit designs), such as: circuit A 438-1 and/or circuit B 438-2. In particular, an EDA environment associated with the design session may be displayed in a graphical user interface on display 416.

Based at least on user inputs provided using a user-interface device (such as keyboard 418 or pointer 420, which may be a mouse), in a cycle-tapping mode selection module 432 may scroll through multiple objects in a circuit design (such as circuit A 438-1), and may select a tap object 440. Note that the objects displayed on display 416 may also be based on current cursor location 442 and an active or current design command 444. Alternatively or additionally, selection module 432 may select tap object 440 for the user (i.e., without additional user input or action). For example, distance module 434 may determine the object from a set of objects with the minimum distance to current cursor location 442.

If there are multiple objects in different layers in circuit A 438-1, which are associated with current cursor location 442, information about these objects may be temporarily stored in tap set 446. This information may be used if the user subsequently indicates that tap object 440 was incorrectly selected. In the event of such an error, the user may cycle tap through a remainder of tap set 446, and may apply recent design changes 448, which were made after tap object 440 was selected, to a different object in tap set 446.

In some embodiments, when tap object 440 is selected, associated attributes 450 are inferred. These attributes may be applied in recent design changes 448, such as in an interconnect from cursor location 442 that the user creates.

Instructions in the various modules in the memory 424 may be implemented in: a high-level procedural language, an object-oriented programming language, and/or in an assembly or machine language. Note that the programming language may be compiled or interpreted, e.g., configurable or configured, to be executed by the one or more processing units 410.

Computer system 400 may include a variety of devices, such as: a personal computer, a laptop computer, a server, a work station, a mainframe computer, and/or other device capable of manipulating computer-readable data.

Although computer system 400 is illustrated as having a number of discrete items, FIG. 4 is intended to be a functional description of the various features that may be present in computer system 400 rather than a structural schematic of the embodiments described herein. In practice, and as recognized by those of ordinary skill in the art, the functions of computer system 400 may be distributed over a large number of servers or computers, with various groups of the servers or computers performing particular subsets of the functions. Consequently, computer system 400 may be at one location or may be distributed across multiple locations, such as computing systems that communicate via a network (such as the Internet or an intranet).

In some embodiments, some or all of the functionality of computer system 400 may be implemented in one or more: application-specific integrated circuit (ASICs), field-programmable gate array (FPGAs), and/or one or more digital signal processors (DSPs). Note that the functionality of computer system 400 may be implemented more in hardware and less in software, or less in hardware and more in software, as is known in the art.

Figure 5:
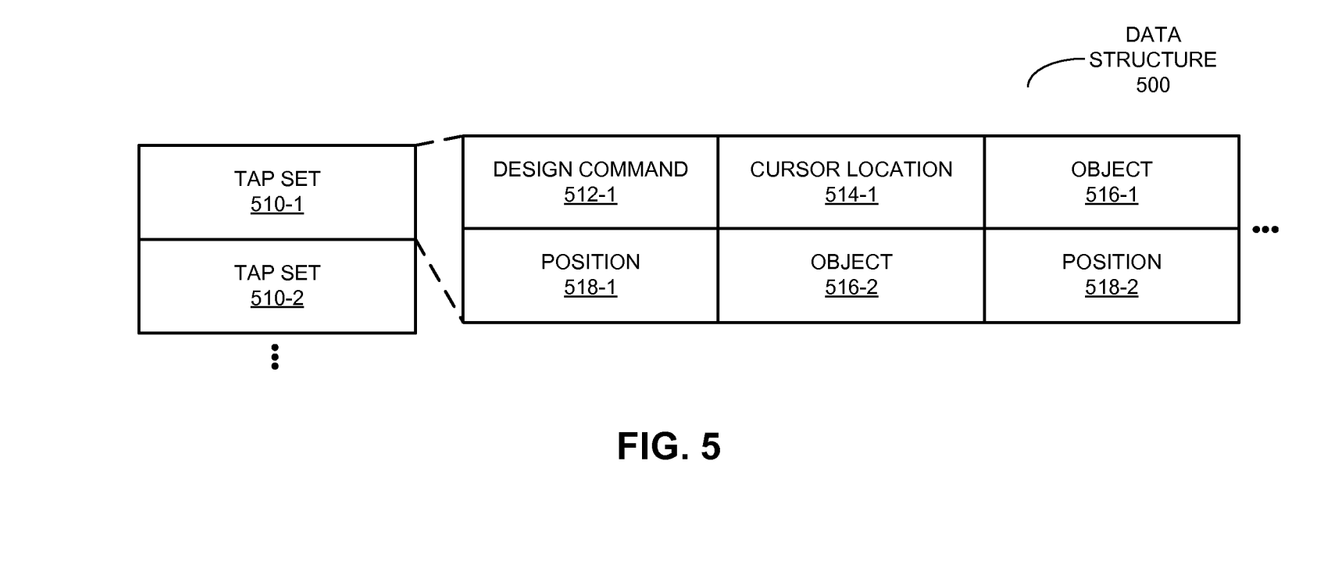
FIG. 5 is a block diagram illustrating a data structure for use in conjunction with the computer system of FIG. 4 in accordance with an embodiment of the present disclosure.

We now discuss embodiments of data structures that may be used in computer system 400. FIG. 5 presents a block diagram illustrating a data structure 500. This data structure may include one or more tap sets 510, which may be associated with different design commands. For example, tap set 510-1 may include: a design command 512-1, an initial cursor location 514-1, and multiple objects 516 and their associated positions 518 (which are proximate to cursor location 514-1).

In some embodiments, computer system 400 (FIG. 4) and/or data structure 500 include fewer or additional components. Moreover, two or more components may be combined into a single component and/or a position of one or more components may be changed.

While the preceding embodiments have used EDA software as an illustrative example, the technique for selecting an object may be used with a wide variety of software, including: software applications, software development tools, firmware, operating systems and/or software testing tools.

The foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art. Additionally, the above disclosure is not intended to limit the present disclosure. The scope of the present disclosure is defined by the appended claims.

What is claimed is:

1. A computer-implemented method, comprising:
receiving a cursor location in an electronic design automation (EDA) environment, wherein the EDA environment includes multiple objects;
determining a subset of the multiple objects based on the cursor location;
selecting a first object from the subset of multiple objects;
creating a first new object and populating at least one property of the first new object based on a corresponding property of the first object, wherein creating the first new object comprises performing a first sequence of operations, and wherein the first new object is a different type of object than the first object; and
in response to receiving error information that indicates that the first new object has an error,
removing the first new object,
receiving a selection of a second object from the subset of multiple objects, wherein the second object is selected by cycle-tapping through the subset of the multiple objects, and
responsive to receiving the selection of the second object, creating a second new object by reapplying the first sequence of operations and populating at least one property of the second new object based on a corresponding property of the second object,
wherein the second new object is a different type of object than the second object.

2. The method of claim 1, wherein the selecting involves:
determining distances between the cursor location and objects in at least the subset of the multiple objects; and
identifying the minimum distance in the distances, which is associated with the first object.

3. The method of claim 2,
wherein the subset of the multiple objects includes a via or an instance between layers in the multiple layers.

4. The method of claim 1, wherein the method further includes receiving a user input that specifies the current design command.

5. The method of claim 1, wherein the method further includes receiving an object-selection input from a user-interface device prior to selecting the first object; and
wherein the selecting the first object is further based on the object-selection input.

6. The method of claim 5, wherein the object-selection input specifies a subset of the multiple objects that are proximate to the cursor location and which include the first object.

7. The method of claim 5, wherein the user-interface device includes a mouse and the object-selection input corresponds to a mouse click.

8. The method of claim 5, wherein the user-interface device includes a keyboard and the object-selection input corresponds to a keyboard shortcut; and
wherein the keyboard shortcut is associated with one or more keyboard keys or keyboard icons.

9. The method of claim 1, wherein the method further includes:
receiving, from the user, position information for the first new object in the circuit design; and
presenting the first new object in the EDA environment based at least on the position information.

10. The method of claim 9, wherein the position information corresponds to a change in the cursor location.

11. The method of claim 9, wherein the method further includes receiving a selection of attributes of the first object in the circuit design based at least on the current design command.

12. The method of claim 11, wherein the method further includes storing information associated with the attributes.

13. A non-transitory computer-readable storage medium storing instructions that are executable by a computer, the instructions comprising:
instructions for receiving a cursor location in an electronic design automation (EDA) environment, wherein the EDA environment includes multiple objects;
instructions for determining a subset of the multiple objects based on the cursor location;
instructions for selecting a first object from the subset of multiple objects;
instructions for creating a first new object and populating at least one property of the first new object based on a corresponding property of the first object, wherein creating the first new object comprises performing a first sequence of operations, and wherein the first new object is a different type of object than the first object; and
instructions for, in response to receiving error information that indicates that the first new object has an error,
removing the first new object,
receiving a selection of a second object from the subset of multiple objects, wherein the second object is selected by cycle-tapping through the subset of the multiple objects, and
responsive to receiving the selection of the second object, creating a second new object by reapplying the first sequence of operations and populating at least one property of the second new object based on a corresponding property of the second object, wherein the second new object is a different type of object than the second object.

14. The computer-program product of claim 13, wherein the computer-program mechanism further includes instructions for receiving an object-selection input from a user-interface device prior to selecting the first object; and
wherein the selecting is further based on the object-selection input.

15. A computer system, comprising:
a processor;
memory; and
a program module, wherein the program module is stored in the memory and configured to be executed by the processor, the program module including:
instructions for receiving a cursor location in an electronic design automation (EDA) environment, wherein the EDA environment includes multiple objects;
instructions for determining a subset of the multiple objects based on the cursor location;
instructions for selecting a first object from the subset of multiple objects;
instructions for creating a first new object and populating at least one property of the first new object based on a corresponding property of the first object, wherein creating the first new object comprises performing a first sequence of operations, and wherein the first new object is a different type of object than the first object; and
instructions for, in response to receiving error information that indicates that the first new object has an error,
removing the first new object, receiving a selection of a second object from the subset of multiple objects, wherein the second object is selected by cycle-tapping through the subset of the multiple objects, and responsive to receiving the selection of the second object, creating a second new object by reapplying the first sequence of operations and populating at least one property of the second new object based on a corresponding property of the second object, wherein the second new object is a different type of object than the second object.

* * * * *